United States Patent
Sako

(10) Patent No.: US 10,153,172 B2
(45) Date of Patent: Dec. 11, 2018

(54) ETCHING METHOD AND RECORDING MEDIUM

(71) Applicant: TOKYO ELECTRON LIMITED, Tokyo (JP)

(72) Inventor: Takuji Sako, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/935,679

(22) Filed: Mar. 26, 2018

(65) Prior Publication Data
US 2018/0286695 A1    Oct. 4, 2018

(30) Foreign Application Priority Data
Mar. 28, 2017    (JP) .................................. 2017-062655

(51) Int. Cl.
*H01L 21/311*    (2006.01)
*H01L 21/02*    (2006.01)

(52) U.S. Cl.
CPC ... *H01L 21/31116* (2013.01); *H01L 21/02164* (2013.01)

(58) Field of Classification Search
None
See application file for complete search history.

(56) References Cited

U.S. PATENT DOCUMENTS 8,058,179 B1 *    11/2011  Draeger ............ H01L 21/02164
                                                         156/345.26

FOREIGN PATENT DOCUMENTS

JP    2009-94307 A    4/2009
JP    2007-180418 A   7/2017

\* cited by examiner

*Primary Examiner* — Roberts P Culbert
(74) *Attorney, Agent, or Firm* — Nath, Goldberg & Meyer; Jerald L. Meyer

(57) ABSTRACT

A method of etching a silicon oxide film on a substrate, includes generating reaction products containing moisture by modifying the silicon oxide film by supplying a mixed gas containing a gas containing a halogen element and a basic gas onto the surface of the silicon oxide film and making chemical reaction of the silicon oxide film with the mixed gas, generating different reaction products by modifying the silicon oxide film by supplying the gas containing a halogen element onto an interface between the silicon oxide film and the reaction products and making a chemical reaction on the silicon oxide film with the gas containing a halogen element by using the moisture contained in the reaction products, and heating and removing the reaction products and the different reaction products.

10 Claims, 10 Drawing Sheets

ETCHING METHOD AND RECORDING MEDIUM

CROSS-REFERENCE TO RELATED APPLICATION

This application is based upon and claims the benefit of priority from Japanese Patent Application No. 2017-062655, filed on Mar. 28, 2017, the entire contents of which are incorporated herein by reference.

TECHNICAL FIELD

The present disclosure relates to a method of etching a silicon oxide film formed on a substrate such as a semiconductor wafer, and a recording medium.

BACKGROUND

A method of dry-etching a silicon oxide film present on the surface of a semiconductor wafer (hereinafter referred to as a "wafer") without using plasma in a process of manufacturing a semiconductor device is known. Such a dry-etching method includes a modifying process of generating reaction products by modifying a silicon oxide film by putting a chamber accommodating a wafer into a low pressure state close to a vacuum state and supplying a gas containing at least a hydrogen fluoride gas (HF) into the chamber while adjusting the temperature of the wafer to a predetermined temperature, and a heating process of heating and vaporizing (subliming) the reaction products. This dry-etching method is to etch the silicon oxide film by modifying the surface of the silicon oxide film into the reaction products and heating the reaction products. In the modifying process of the conventional dry-etching method, a mixed gas containing a hydrogen fluoride gas and an ammonia gas ($NH_3$) is supplied to modify the silicon oxide film to produce the reaction products.

The above-described dry-etching method is applied, for example, to a process of etching an oxide film 102 of a wafer W having the structure shown in FIG. 1. As shown in FIG. 1, an interlayer insulating film 101 is formed on the surface of the Si layer 100 of the wafer W. A trench H (for example, a contact hole) is formed in the interlayer insulating film 101, and a silicon oxide film 102 is formed at the bottom of the trench H. A SiN film 103, which is an insulator, is formed on the side wall portion of the trench H.

However, in the conventional dry-etching method, when etching the silicon oxide film 102 formed at the bottom of the trench H of the wafer W, as the processing progresses, the reaction of the silicon oxide film 102 with the mixed gas in the modifying process becomes less active and the amount of modification of the silicon oxide film 102 becomes saturated.

This phenomenon is caused by the reaction products (ammonium fluorosilicate) generated by the reaction between the ammonia gas in the mixed gas and the silicon oxide film 102. As shown in FIG. 2, the reaction products 104 in the trench H are thick in proportion to the modification processing time of the silicon oxide film 102 in the modifying process. When the reaction products 104 are thickly formed in the trench H, the passage speed of the mixed gas decreases, which makes it difficult for the mixed gas to reach the silicon oxide film 102 at the bottom of the trench H. This makes it difficult for the silicon oxide film 102 to be modified at the bottom of the trench H and leaves an unnecessary silicon oxide film 102, even when the reaction products 104 are sublimated in the subsequent heating process.

As described above, although the modification reaction between the silicon oxide film 102 and the mixed gas becomes less active as the process progresses, it is possible to modify all the silicon oxide film 102 at the bottom of the trench H by prolonging the modification processing time. However, when the modification processing time is prolonged, there may be a problem that a portion which is not an etching target is modified, etc.

In addition, in order to sufficiently remove the silicon oxide film 102, it is sometimes necessary to repeat the modification process and the heating process many times. However, when changing from the modification process to the heating process, a process of transferring a wafer to a separate heating chamber is required. Therefore, when the number of times the modification process and the heating process are executed is large, the productivity is lowered.

SUMMARY

Some embodiments of the present disclosure provide an etching method capable of sufficiently etching a silicon oxide film with high productivity without etching a portion which is not an etching target.

According to one embodiment of the present disclosure, there is provided a method of etching a silicon oxide film on a substrate, includes generating reaction products containing moisture by modifying the silicon oxide film by supplying a mixed gas containing a gas containing a halogen element and a basic gas onto the surface of the silicon oxide film and making chemical reaction of the silicon oxide film with the mixed gas, generating different reaction products by modifying the silicon oxide film by supplying the gas containing a halogen element onto an interface between the silicon oxide film and the reaction products and making a chemical reaction on the silicon oxide film with the gas containing a halogen element by using the moisture contained in the reaction products, and heating and removing the reaction products and the different reaction products.

According to another embodiment of the present disclosure, there is provided a non-transitory computer-readable recording medium storing a program that causes a control computer of a processing system to perform the above described etching method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
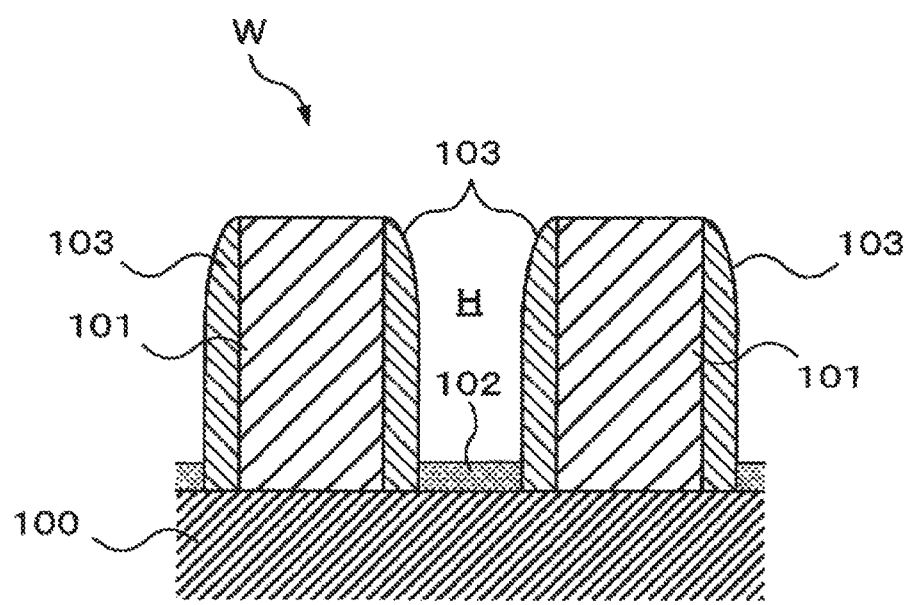
FIG. 1 is a schematic longitudinal sectional view showing the structure of a surface (device forming surface) of a wafer before etching a silicon oxide film.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be now described with reference to the drawings. Throughout the present specification and the drawings, elements having substantially the same functional configuration are denoted by the same reference numerals and explanation of which will be omitted.

First, the state of a wafer, which is a substrate to be processed by an etching method according to an embodiment of the present embodiment, will be described. As shown in FIG. 1, a wafer W is, for example, a thin silicon wafer formed in a disk shape, and an interlayer insulating film 101 is, for example, formed on the surface of a silicon (Si) layer 100. This interlayer insulating film 101 is formed of, for example, an HDP-$SiO_2$ film which is a CVD (Chemical Vapor Deposition)-based silicon oxide film (plasma CVD oxide film) formed by bias high density plasma CVD (HDP-CVD).

For example, a trench H used as a contact hole is formed in the interlayer insulating film 101 and, for example, an SiN film 103 which is an insulator is formed in the side wall portion of the trench H. The lower end portion of the SiN film 103 is formed up to a position in contact with the upper surface of the Si layer 100. In addition, a silicon oxide film 102 is formed at the bottom of the trench H. Specifically, the bottom wall of the trench H is constituted by the silicon oxide film 102. The silicon oxide film 102 is, for example, a thermal oxide film, which hereinafter may be sometimes referred to as a thermal oxide film 102.

The trench H has a structure in which the ratio (D/W) of depth D to opening width W is high. That is, the trench H is formed to have a high aspect ratio. The opening width W is, for example, 25 nm.

Next, a processing system for etching the thermal oxide film 102 formed at the bottom of the trench H with respect to the wafer W will be described. A processing system 1 shown in FIG. 3 includes a loading/unloading part 2 for loading/unloading a wafer W into/from the processing system 1, two load lock chambers 3 installed adjacent to the loading/unloading part 2. PHT (Post Heat Treatment) processing apparatuses 4 that are installed respectively adjacent to the load lock chambers 3 and perform a PHT processing process which is a heating process, COR (Chemical Oxide Removal) processing apparatuses 5 that are installed respectively adjacent to the PHT processing apparatuses 4 and perform a COR processing process which is a modifying process, and a control computer 8 that gives control instructions to the parts of the processing system 1. The PHT processing apparatuses 4 and the COR processing apparatuses 5 respectively connected to the load lock chambers 3 are arranged in a straight line in this order from the load lock chamber 3 side.

The loading/unloading part 2 has a transfer chamber 12 in which a first wafer transfer mechanism 11 for transferring, for example, a disk-shaped wafer W is installed. The first wafer transfer mechanism 11 has two transfer arms 11a and 11b for holding the wafer W substantially horizontally. A mounting table 13 on which a cassette 13a capable of accommodating a plurality of wafers W is mounted is installed on the side of the transfer chamber 12. In this example, the number of mounting tables 13 is three. In addition, an orienter 14 for optically obtaining the amount of eccentricity by rotating the wafer W and performing alignment is installed.

In the loading/unloading part 2, the wafer W is held by the transfer arms 11a and 11b and is rotated, moved rectilinearly and lifted in the substantially horizontal plane by the driving of the first wafer transfer mechanism 11, so that the wafer W is transferred to a desired position. Then, the transfer arms 11a and 11b are advanced and retracted with respect to the cassette 13a, the orienter 14 and the load lock chamber 3 on the mounting table 10, respectively, so that the wafer W can be loaded and unloaded.

Each load lock chamber 3 is connected to the transfer chamber 12 with a gate valve 16 interposed between the load lock chamber 3 and the transfer chamber 12. A second wafer transfer mechanism 17 for transferring the wafer W is installed in each load lock chamber 3. The second wafer transfer mechanism 17 has a transfer arm 17a for holding the wafer W substantially horizontally. Further, the load lock chamber 3 can be evacuated.

In the load lock chamber 3, the wafer W is held by the transfer arm 17a and is transferred by being rotated, moved rectilinearly and lifted in the substantially horizontal plane by the driving of the second wafer transfer mechanism 17. The transfer arm 17a is advanced and retracted with respect to the PHT processing apparatus 4 connected in tandem to each load lock chamber 3, so that the wafer W can be loaded into and unloaded from the PHT processing apparatus 4. Further, the transfer arm 17a is advanced and retracted with respect to each COR processing apparatus 5 via each PHT processing apparatus 4, so that the wafer W can be loaded into and unloaded from the COR processing apparatus 5.

The PHT processing apparatus 4 includes a sealed processing chamber (processing space) 21 in which the wafer W is accommodated. Although not shown, a loading/unloading port for loading/unloading the wafer W into/from the processing chamber 21 is installed, and a gate valve 22 for opening/closing the loading/unloading port is installed. The processing chamber 21 is connected to the load lock chamber 3 with the gate valve 22 interposed between the processing chamber 21 and the load lock chamber 3.

Figure 4:
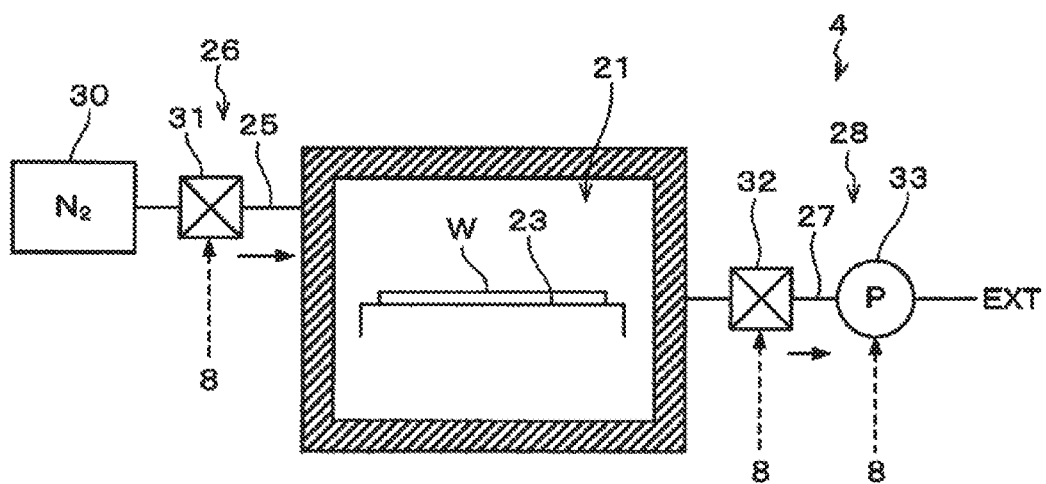
FIG. 4 is an explanatory view showing the configuration of a PHT processing apparatus.

As shown in FIG. 4, a mounting table 23 on which the wafer W is mounted substantially horizontally is installed in the processing chamber 21 of the PHT processing apparatus 4. Further, a supply mechanism 26 having a supply path 25 for heating and supplying an inert gas such as a nitrogen gas ($N_2$) into the processing chamber 21 and an exhaust mechanism 28 having an exhaust path 27 for exhausting the processing chamber 21 are installed in the processing chamber 21. The supply path 25 is connected to a nitrogen gas supply source 30. Further, a flow rate regulating valve 31 capable of opening/closing the supply path 25 and adjusting the supply flow rate of nitrogen gas is disposed on the supply path 25. An opening/closing valve 32 and an exhaust pump 33 for performing forced exhaust are disposed on the exhaust path 27.

The operations of the parts such as the gate valve 22, the flow rate regulating valve 31, the opening/closing valve 32, the exhaust pump 33, etc. of the PHT processing apparatus 4 are controlled by control commands of the control computer 8. That is, the supply of nitrogen gas by the supply mechanism 26, the exhaust by the exhaust mechanism 28, and the like are controlled by the control computer 8.

Figure 5:
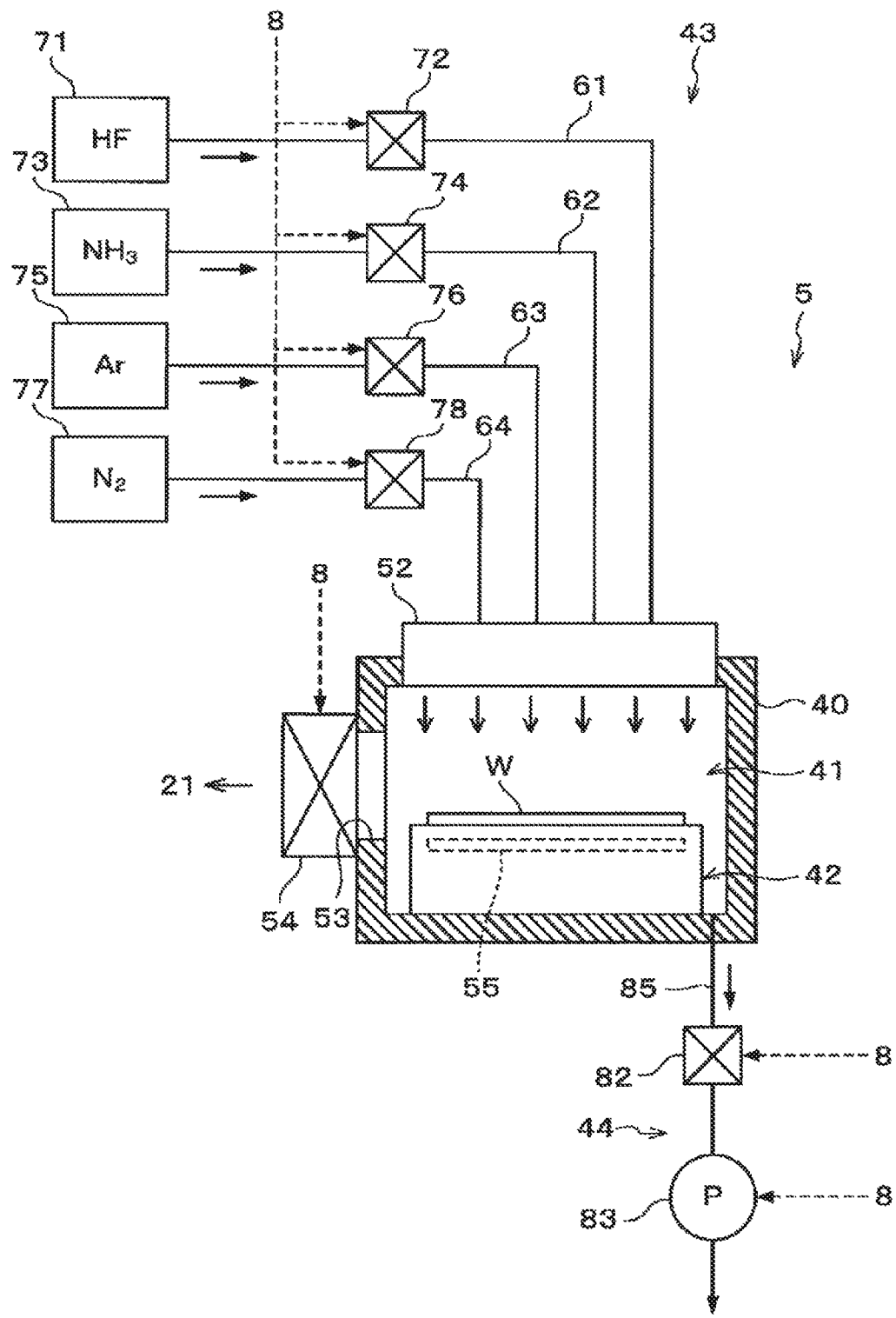
FIG. 5 is an explanatory view showing the configuration of a COR processing apparatus.
Figure 6:
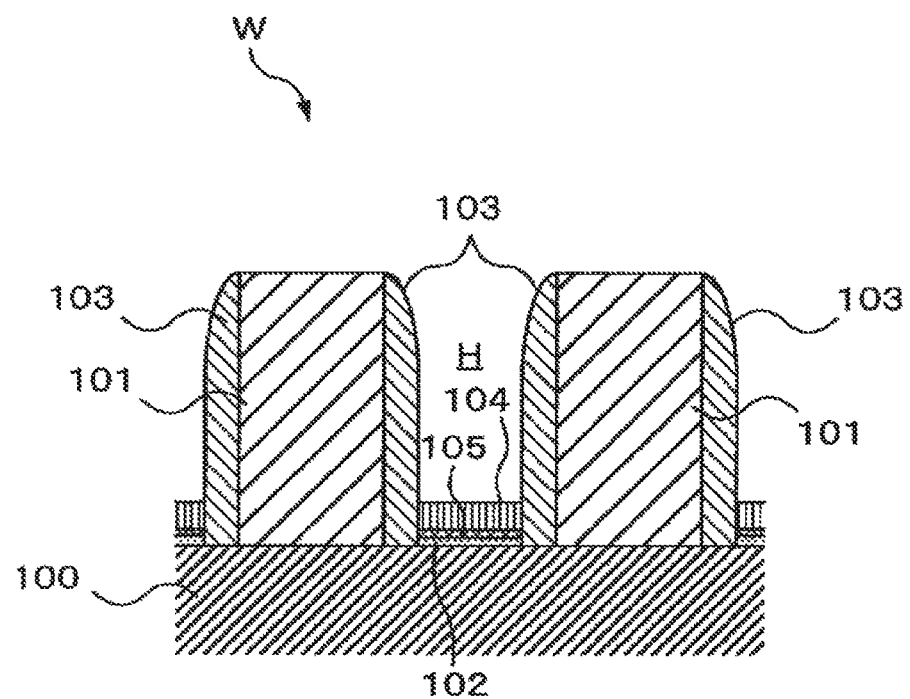
FIG. 6 is a schematic longitudinal sectional view showing the state of a wafer surface obtained using an etching method according to an embodiment of the present disclosure.

As shown in FIG. 5, the COR processing apparatus 5 includes a sealed chamber 40, and in the interior of the chamber 40 is a processing chamber (processing space) 41 in which the wafer W is accommodated. A mounting table 42 on which the wafer W is mounted substantially horizontally is installed in the chamber 40. A supply mechanism 43 for supplying a gas into the processing chamber 41 and an exhaust mechanism 44 for exhausting the interior of the processing chamber 41 are also installed in the COR processing apparatus 5.

A loading/unloading port 53 for loading/unloading the wafer W into/from the processing chamber 41 is installed on the side wall portion of the chamber 40, and a gate valve 54 for opening/closing the loading/unloading port 53 is installed. The processing chamber 41 is connected to the processing chamber 21 with the gate valve 54 interposed between the processing chamber 41 and the processing chamber 21 of the PHT processing apparatus 4. A shower head 52 having a plurality of discharge ports for discharging the processing gas is installed at the ceiling portion of the chamber 40.

The mounting table 42 is substantially circular when viewed from the top and is fixed to the bottom of the chamber 40. A temperature regulator 55 for regulating the temperature of the mounting table 42 is installed in the mounting table 42. The temperature regulator 55 has a conduit through which a liquid for temperature regulation (e.g., water) is circulated. The temperature of the upper surface of the mounting table 42 is regulated by performing heat exchange with the liquid flowing in the conduit, and the temperature of the wafer W is regulated by performing heat exchange between the mounting table 42 and the wafer W on the mounting table 42. The temperature regulator 55 is not limited to that described above but may be an electric heater or the like for heating the mounting table 42 and the wafer W by using resistance heat.

The supply mechanism 43 includes the above-described shower head 52, a hydrogen fluoride gas supply path 61 for supplying a hydrogen fluoride gas (HF) into the processing chamber 41, an ammonia gas supply path 62 for supplying an ammonia gas ($NH_3$) into the processing chamber 41, an argon gas supply path 63 for supplying an argon gas (Ar) as an inert gas into the processing chamber 41, and a nitrogen gas supply path 64 for supplying a nitrogen gas ($N_2$) as an inert gas into the processing chamber 41. The hydrogen fluoride gas supply path 61, the ammonia gas supply path 62, the argon gas supply path 63 and the nitrogen gas supply path 64 are connected to the shower head 52 through which the fluoride hydrogen gas, the ammonia gas, the argon gas and the nitrogen gas are discharged and diffused into the processing chamber 41.

The hydrogen fluoride gas supply path 61 is connected to a hydrogen fluoride gas supply source 71. A flow rate regulating valve 72 capable of opening and closing the hydrogen fluoride gas supply path 61 and regulating the supply flow rate of hydrogen fluoride gas is disposed on the hydrogen fluoride gas supply path 61. The ammonia gas supply path 62 is connected to an ammonia gas supply source 73. A flow rate regulating valve 74 capable of opening and closing the ammonia gas supply path 62 and regulating the supply flow rate of ammonia gas is disposed on the ammonia gas supply path 62. The argon gas supply path 63 is connected to an argon gas supply source 75. A flow rate regulating valve 76 capable of opening and closing the argon gas supply path 63 and regulating the supply flow rate of argon gas is disposed on the argon gas supply path 63. The nitrogen gas supply path 64 is connected to a nitrogen gas supply source 77. A flow rate regulating valve 78 capable of opening and closing the nitrogen gas supply path 64 and regulating the supply flow rate of nitrogen gas is disposed on the nitrogen gas supply path 64.

The exhaust mechanism 44 includes an opening/closing valve 82 and an exhaust path 85 on which an exhaust pump 83 for performing forced exhaust is disposed. The end opening of the exhaust path 85 is opened to the bottom of the chamber 40.

The operations of the parts such as the gate valve 54, the temperature regulator 55, the flow rate regulating valves 72, 74, 76 and 78, the opening/closing valve 82, the exhaust pump 83, etc. of the COR processing apparatus 5 are controlled by the control commands of the control computer 8. That is, the supply of the hydrogen fluoride gas, the ammonia gas, the argon gas and the nitrogen gas by the supply mechanism 43, the exhaust by the exhaust mechanism 44, the temperature regulation by the temperature regulator 55, etc. are controlled by the control computer 8.

Each functional element of the processing system 1 is connected via a signal line to the control computer 8 which automatically controls the overall operation of the processing system 1. Here, the functional element includes all elements operated to realize predetermined process conditions, such as the first wafer transfer mechanism 11, the second wafer transfer mechanism 17, the gate valve 22, the flow rate regulating valve 31 and the exhaust pump 33 of the PHT processing apparatus 4, the gate valve 54, the temperature regulator 55, the flow rate regulating valves 72, 74, 76 and 78, the opening/closing valve 82 and the exhaust pump 83 of the COR processing apparatus 5, and the like. The control computer 8 is typically a general-purpose computer capable of realizing arbitrary functions depending on software to be executed.

Figure 3:
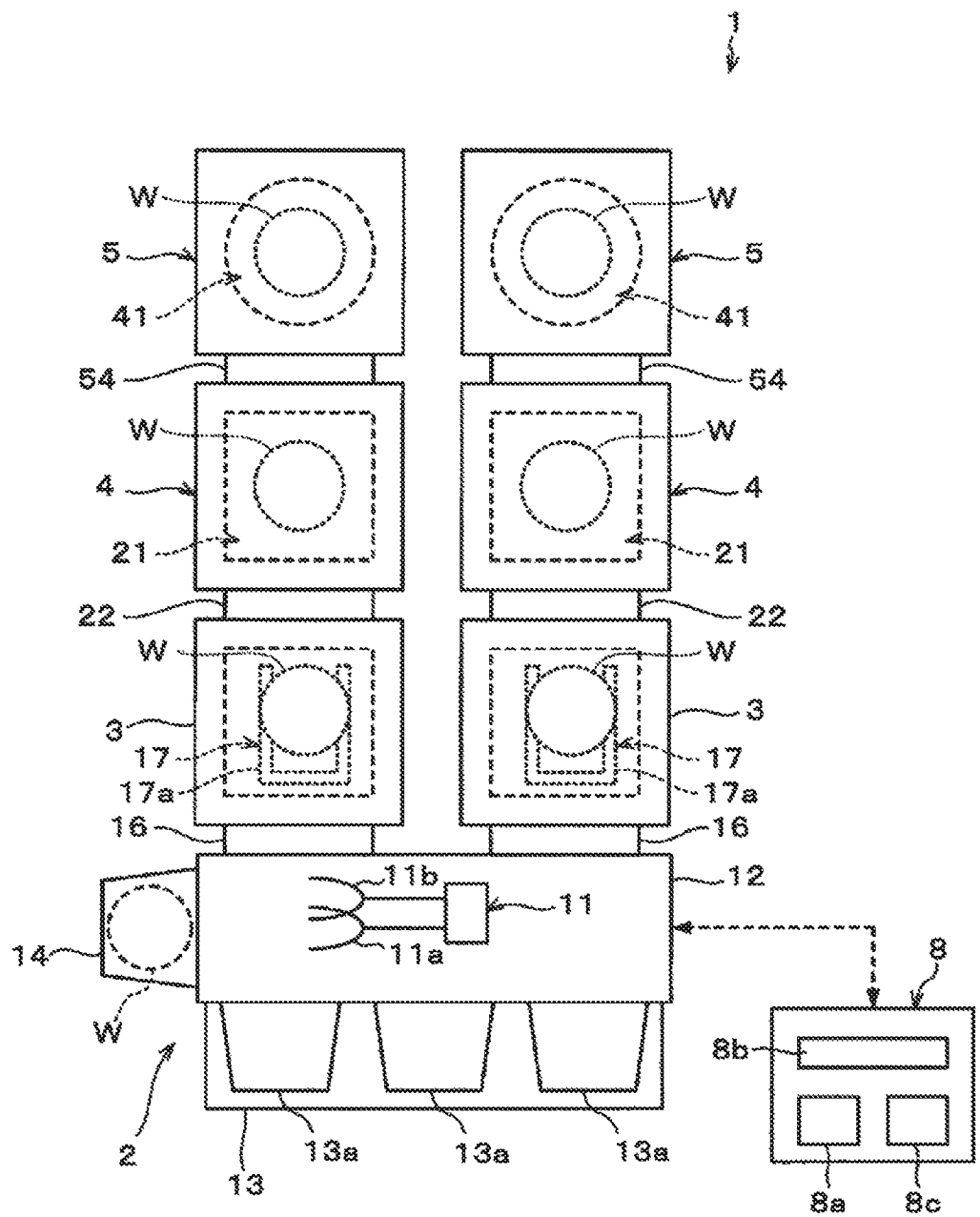
FIG. 3 is a schematic plan view of a processing system.

As shown in FIG. 3, the control computer 8 includes an operation part 8a having a CPU (central processing unit), an input/output part 8b connected to the operation part 8a, and a recording medium 8c that is inserted in the input/output part 8b and stores control software (program) which causes the processing system 1 to perform a predetermined substrate processing method to be described later when it is executed by the control computer 8. When the control software is executed, the control computer 8 controls each functional element of the processing system 1 to realize various process conditions (for example, the pressure of the processing chamber 41) defined by a predetermined process recipe. That is, as will be described in detail later, the control computer 8 issues a control command for realizing an etching method in which the COR processing process in the COR processing apparatus 5 and the PHT processing process in the PHT processing apparatus 4 are performed in this order.

The recording medium 8c may be fixedly installed in the control computer 8 or may be removably attached to a reader device (not shown) installed in the control computer 8 and readable by the reading device. In the most typical example, the recording medium 8c is a hard disk drive in which control software is installed by a service man of a maker of the processing system 1. In another example, the recording medium 8c is a movable disk such as a CD-ROM or a DVD-ROM in which control software is written. Such a removable disk is read by an optical reader (not shown) installed in the control computer 8. In addition, the recording medium 8c may be either a RAM (Random Access Memory) or a ROM (Read Only Memory). Further, the recording medium 8c may be a cassette type ROM or the like. In short, anything known in the computer technical field can be used as the recording medium 8c. In a factory in which a plurality of processing systems 1 is arranged, the control software may be stored in a management computer that comprehensively controls the control computer 8 of each processing system 1. In this case, each processing system 1 is operated by the management computer via a communication line to execute a predetermined process.

Next, a method of processing the wafer W in the processing system 1 configured as described above will be described. First, the wafer W on which the trench H is formed is accommodated in the cassette 13a and is transferred to the processing system 1.

In the processing system 1, the cassette 13a in which a plurality of wafers W is accommodated is mounted on the mounting table 13, one wafer W is taken out from the cassette 13a by the first wafer transfer mechanism 11 and is loaded into the load lock 3. When the wafer W is loaded into the load lock chamber 3, the load lock chamber 3 is hermetically sealed and depressurized. Thereafter, the gate valves 22 and 54 are opened so that the load lock chamber 3, the processing chamber 21 of the PHT processing apparatus 4 and the processing chamber 41 of the COR processing apparatus 5 which are depressurized with respect to the atmospheric pressure, are made to communicate with each other. The wafer W is unloaded from the load lock chamber 3 by the second wafer transfer mechanism 17, is moved linearly so as to pass through the loading/unloading port (not shown) of the processing chamber 21, the processing chamber 21, and the loading/unloading port 53 in this order, and is loaded into the processing chamber 41.

In the processing chamber 41, with a device formation surface facing upward, the wafer W is delivered from the transfer arm 17a of the second wafer transfer mechanism 17 to the mounting table 42. When the wafer W is loaded, the transfer arm 17a is retracted from the processing chamber 41, the loading/unloading port 53 is closed, and the processing chamber 41 is hermetically sealed. Then, the COR processing process is started.

After the processing chamber 41 is hermetically sealed, an ammonia gas, an argon gas and a nitrogen gas are supplied into the processing chamber 41 from the ammonia gas supply path 62, the argon gas supply path 63 and the nitrogen gas supply path 64, respectively. Further, the internal pressure of the processing chamber 41 is set to a pressure lower than atmospheric pressure. Further, the temperature of the wafer W on the mounting table 42 is adjusted to a predetermined target value (for example, about 35 degrees C.) by the temperature regulator 55.

Thereafter, the supply of nitrogen gas into the processing chamber 41 is stopped, and the internal pressure of the processing chamber 41 is further reduced.

After stabilizing the internal pressure, a hydrogen fluoride gas is supplied from the hydrogen fluoride gas supply path 61 into the processing chamber 41. The supply amount of argon gas may be reduced by the supply amount of hydrogen fluoride gas at the time when the supply of hydrogen fluoride gas is started.

Here, since an ammonia gas is supplied in advance into the processing chamber 41, by supplying the hydrogen fluoride gas, the atmosphere of the processing chamber 41 is changed to a processing atmosphere composed of a mixed gas including the hydrogen fluoride gas and the ammonia gas. Thus, as the mixed gas is supplied onto the surface of the wafer W in the processing chamber 41, a first COR process (first modifying process) is performed on the wafer W.

Figure 2:
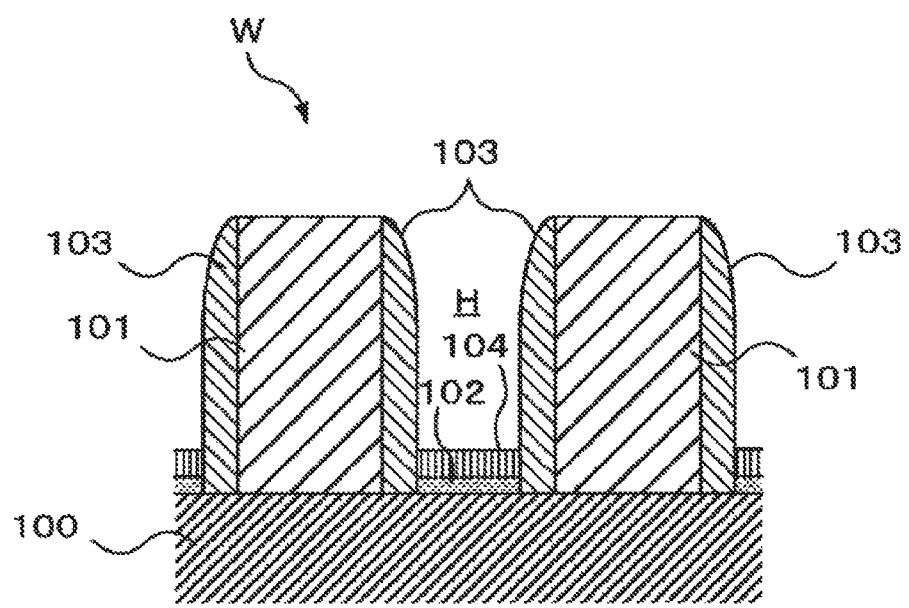
FIG. 2 is a schematic longitudinal sectional view showing the state of a wafer surface obtained using a conventional etching method.

Under the low pressure processing atmosphere in the processing chamber 41, the thermal oxide film 102 present at the bottom of the trench H of the wafer W is modified into reaction products 104 by chemical reaction with the molecules of the hydrogen fluoride gas and the molecules of the ammonia gas in the mixed gas (see FIG. 2). The reaction products 104 may be ammonium fluorosilicate, moisture or the like. This chemical reaction proceeds from the bottom of the trench H toward the upper surface of the Si layer 100.

During the first COR process, by adjusting the supply flow rate of each processing gas, the supply flow rate of the inert gas, the exhaust flow rate, etc., the pressure of the mixed gas (processing atmosphere) may be set to fall within a range of 50 mTorr (about 6.8 Pa) to 300 mTorr (about 40.0 Pa), which is lower than atmospheric pressure. In addition, the partial pressure of the hydrogen fluoride gas in the mixed gas may be adjusted to fall within a range of 5 mTorr (about 0.7 Pa) to 100 mTorr (about 13.3 Pa). In addition, the temperature of the mixed gas (processing atmosphere) may be adjusted to fall within a range of 20 degrees C. to 120 degrees C., particularly 60 degrees C. to 100 degrees C. In addition, the flow rate of the mixed gas may be set to about four times the flow rate of the hydrogen fluoride gas. The flow rate of the hydrogen fluoride gas may be set to 100 sccm or less.

The processing time of the first COR process is appropriately changed depending on the thickness of the thermal oxide film 102. However, considering that a second COR process to be described later is subsequently performed, the processing time from the viewpoint of productivity is not prolonged in some embodiments. In addition, if the processing time of the first COR process is prolonged, etching of the SiN film 103 is begun. Therefore, the processing time of the first COR process may be set to 30 seconds or less in some embodiments.

In addition, the temperature of the wafer W, that is, the temperature of a portion where the chemical reaction is performed in the thermal oxide film 102 (the temperature of a portion where the thermal oxide film 102 and the mixed gas contact each other), may be maintained at a constant temperature of, for example, about 35 degrees C. or more. This can promote the chemical reaction to increase the formation rate of the reaction products 104, thereby rapidly forming a layer of the reaction products 104. The sublimation point of ammonium fluorosilicate in the reaction products 104 is about 100 degrees C. Therefore, if the temperature of the wafer W is set to 100 degrees C. or higher, there is a possibility that the reaction products 104 are not advantageously formed. Therefore, the temperature of the wafer W is set to about 100 degrees C. or less in some embodiments.

By performing the first COR process for a predetermined time in this way, the thermal oxide film 102 is modified to generate the reaction products 104. However, as the processing time elapses, the thickness of the reaction products 104 gradually increases and the rate at which the mixed gas permeates the reaction products 104 gradually decreases. As a result, the amount of the mixed gas in contact with the thermal oxide film 102 decreases and the amount of modification of the thermal oxide film 102 decreases.

To avoid this problem, in the present embodiment, after performing the first COR process, the second COR process (second modifying process) is further performed on the wafer W. That is, after performing the first COR process with the mixed gas including the hydrogen fluoride gas and the ammonia gas for a predetermined time, the second COR process with a hydrogen fluoride gas is performed without using an ammonia gas.

Specifically, prior to the second COR process, the supply of ammonia gas and hydrogen fluoride gas into the processing chamber 41 is stopped, and a nitrogen gas is supplied into the processing chamber 41 so as to discharge the ammonia gas from the processing chamber 41.

After stabilizing the pressure in this state, the hydrogen fluoride gas is supplied into the processing chamber 41. The supply amount of argon gas is then reduced by the supply amount of hydrogen fluoride gas in coordination with beginning of the supply of hydrogen fluoride gas. At the same time as the supply of the hydrogen fluoride gas begins, the thermal oxide film 102 is subjected to a modifying process with the mixed gas being supplied into the processing chamber 41 and including the hydrogen fluoride gas, the argon gas and the nitrogen gas. As a result, at the interface between the reaction products 104 and the thermal oxide film 102, the thermal oxide film 102 chemically reacts with the molecules of the hydrogen fluoride gas, with the moisture contained in the reaction products 104 as a catalyst, to be modified into different reaction products 105 such as dihydrogen hexafluorosilicate ($H_2SiF_6$) or the like.

The reason why no ammonia gas is supplied in the second COR process is that the ammonia gas may cause new reaction products 104 to be deposited on the surface of the reaction products (ammonium fluorosilicate) 104, which may result in a decrease in permeation rate of the mixed gas. On the other hand, when the supply of ammonia gas is stopped, no new reaction products 104 are formed on the surface of the reaction products 104, which makes it easy for the mixed gas containing the hydrogen fluoride gas to pass through the reaction products.

By adjusting the supply flow rate of each processing gas, the supply flow rate of the inert gas, the exhaust flow rate, etc. from the start of the first COR process to the completion of the second COR process, the pressure of the mixed gas (processing atmosphere), that is, the internal pressure of the chamber 40, may be kept constant in some embodiments to prevent pressure fluctuation. This is because, when the pressure of the mixed gas is increased, the selectivity of a non-etching target portion with respect to the thermal oxide film 102 decreases and, when the pressure of the mixed gas is decreased, the rate of modification into different reaction products 105 decreases.

The processing time of the second COR process is appropriately changed depending on the thickness of the thermal oxide film 102. However, it may not be beneficial to prolong the processing time from the viewpoint of productivity in some embodiments. In addition, if the processing time of the second COR process is prolonged, etching of the SiN film 103, which is not an etching target, begins. In these instances, the processing time of the second COR process may be set to 30 seconds or less.

The other processing conditions in the second COR process are the same as those in the first COR process in this embodiment.

When a layer of different reaction products 105 is sufficiently formed and the second COR process is completed, the processing chamber 41 is forcibly exhausted and depressurized. As a result, the hydrogen fluoride gas or the like is forcibly discharged from the processing chamber 41. When the forced exhaust of the processing chamber 41 is completed, the loading/unloading port 53 is opened and the wafer W is unloaded from the processing chamber 41 by the second wafer transfer mechanism 17 and is loaded into the processing chamber 21 of the PHT processing apparatus 4. In this manner, the COR processing process is completed.

In the PHT processing apparatus 4, the wafer W is loaded into the processing chamber 21 with the device forming surface facing upward. When the wafer W is loaded, the transfer arm 17a is retracted from the processing chamber 21, the processing chamber 21 is sealed, and the PHT processing process is started. In the PHT processing process, while the interior of the processing chamber 21 is exhausted, a high-temperature heated gas is supplied into the processing chamber 21 to heat the interior of the processing chamber 21. As a result, the reaction products 104 and the different reaction products 105 generated by the COR process are heated and vaporized, passed through the trench H from below the trench H, and discharged outside the wafer W. In this manner, by performing the PHT process after the COR process, the reaction products 104 and the different reaction products 105 can be removed and the thermal oxide film 102 can be dry-etched.

Thereafter, the first COR process, the second COR process and the PHT process are performed by the COR processing apparatus 5 and the PHT processing apparatus 4 in the same manner as described above until the etching of the thermal oxide film 102 is completed.

When the etching is completed, the supply of the heated gas is stopped and the loading/unloading port of the PHT processing apparatus 4 is opened. Thereafter, the wafer W is unloaded from the processing chamber 21 by the second wafer transfer mechanism 17 and is returned to the load lock chamber 3. In this way, the PHT processing process in the PHT processing apparatus 4 is completed.

After the wafer W is returned to the load lock chamber 3 and the load lock chamber 3 is sealed, the load lock chamber 3 and the transfer chamber 12 are brought into communication with each other. Then, the wafer W is unloaded from the load lock chamber 3 by the first wafer transfer mechanism 11 and is returned to the cassette 13a on the mounting table 13. In this way, the series of etching processes in the processing system 1 is completed.

According to the present embodiment, after the conventional COR process (first modifying process), at the interface between the reaction products 104 generated in the first modifying process and the thermal oxide film 102, by performing the COR process (second modifying process) using the hydrogen fluoride gas, with the moisture contained in the reaction products 104 as a catalyst, the thermal oxide film 102 formed at the bottom of the trench H can be sufficiently modified in a short time. Therefore, the modifying process and the heating process required for etching the thermal oxide film 102 having a desired thickness, do not need to repeated as many times, which can result in increased productivity. In addition, since one first modifying process and one second modifying process is as small as 30 seconds or less, it is possible to prevent a portion, which is not an etching target, from being etched, that is, to increase the etching selectivity of the SiN film 103, which is not an etching target, to the thermal oxide film 102, which is an etching target.

Although embodiments of the present disclosure have been described above, the present disclosure is not limited thereto. It is to be understood to those skilled in the art that various modifications or alterations can be made without departing from the scope and spirit of the present disclosure and that such modifications or alterations belong to the technical scope of the present disclosure.

In addition to the hydrogen fluoride gas and the ammonia gas, the kind of gas supplied into the processing chamber 41 is not limited to the combination shown in the above embodiment. For example, the inert gas supplied into the processing chamber 41 may be an argon gas alone. The inert gas may be one of any other inert gases such as a helium gas (He) and a xenon gas (Xe), or may be a mixture of two or more of an argon gas, a nitrogen gas, a helium gas and a xenon gas.

Figure 7:
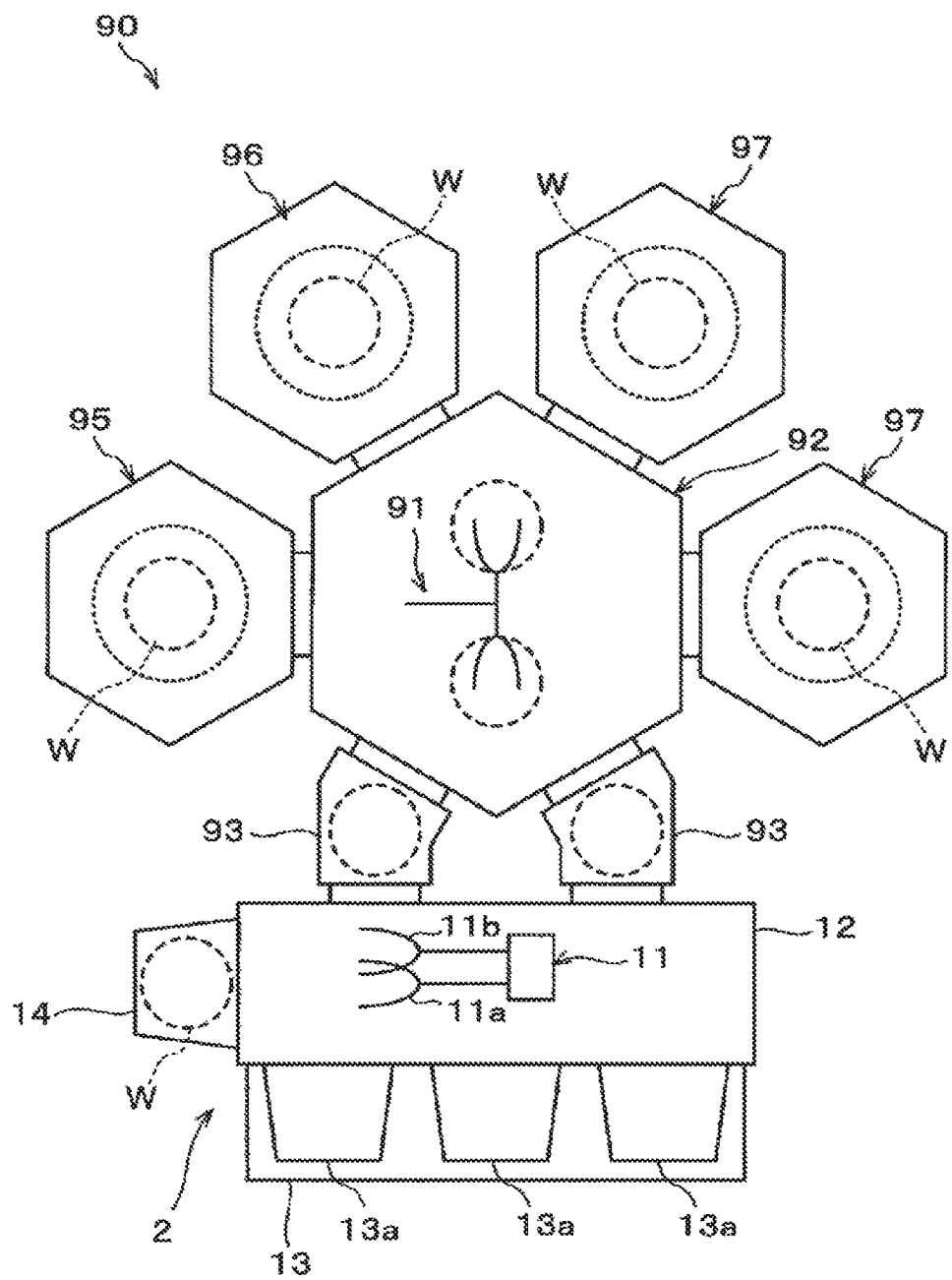
FIG. 7 is a schematic plan view of a processing system according to another embodiment of the present disclosure.

The structure of the processing system 1 is not limited to the one shown in the above embodiment. For example, in addition to the COR processing apparatus and the PHT processing apparatus, a processing system including a film forming apparatus may be used. For example, as in a processing system 90 shown in FIG. 7, a common transfer chamber 92 including a wafer transfer mechanism 91 may be connected to the transfer chamber 12 via a load lock chamber 93, and a COR processing apparatus 95, a PHT processing apparatus 96 and a film forming apparatus 97 such as a CVD apparatus may be arranged around the common transfer chamber 92. In this processing system 90, the wafer W is loaded/unloaded into/from the load lock chamber 93, the COR processing apparatus 95, the PHT processing apparatus 96 and the film forming apparatus 97 by the wafer transfer mechanism 91. The interior of the common transfer chamber 92 can be evacuated. That is, by setting the interior of the common transfer chamber 92 in a vacuum state, the wafer W unloaded from the PHT processing apparatus 96 can be loaded into the film forming apparatus 97 without being brought into contact with oxygen in the atmosphere.

In the above embodiment, the silicon wafer W as a semiconductor wafer is exemplified as a substrate having a silicon oxide film. However, the substrate is not limited thereto but may be glass for an LCD substrate, a CD substrate, a printed circuit board, a ceramic substrate, or the like.

The silicon oxide film as an etching target in the processing system 1 is not limited to the thermal oxide film but may be any other type of silicon oxide film, for example, a CVD-based oxide film such as a HDP-SiO$_2$ film, or a SOD (Spin On Dielectric) oxide film. Depending on the type of the silicon oxide film, the etching amount and the like can be controlled by adjusting the temperature of the silicon oxide film in the COR processing process and the partial pressure of the hydrogen fluoride gas in the mixed gas.

For example, in the wafer W having the structure as shown in FIG. 1, when both the silicon oxide film 102 in the trench H and the interlayer insulating film 101 are formed with the HDP-SiO$_2$ film, when only the silicon oxide film 102 is an etching target, a protective film such as a resist film is formed on the upper surface of the interlayer insulating film 101 so as to prevent the interlayer insulating film 101 from being etched. In this manner, when both a silicon oxide film, which is an etching target, and a silicon oxide film, which is not an etching target, are present on the wafer and it is difficult to increase the etching selectivity of a silicon oxide film, which is not an etching target, to a silicon oxide film, which is an etching target, a protective film is formed around the silicon oxide film which is not an etching target.

In addition, the etching performed in the processing system 1 is not limited to the etching performed on the bottom of the trench H as shown in the embodiment, but the present disclosure can be applied to etching methods of etching different portions.

Further, the structure of the substrate processed in the processing system 1 is not limited to the above.

It has been illustrated above that the thermal oxide film 102 constituting the bottom wall of the trench H is modified. However, for example, as shown in FIGS. 8A and 8B, the COR process according to this embodiment can also be applied to a process of undercutting the thermal oxide film 102 constituting the side wall of the bottom of the trench H.

Figure 8A:
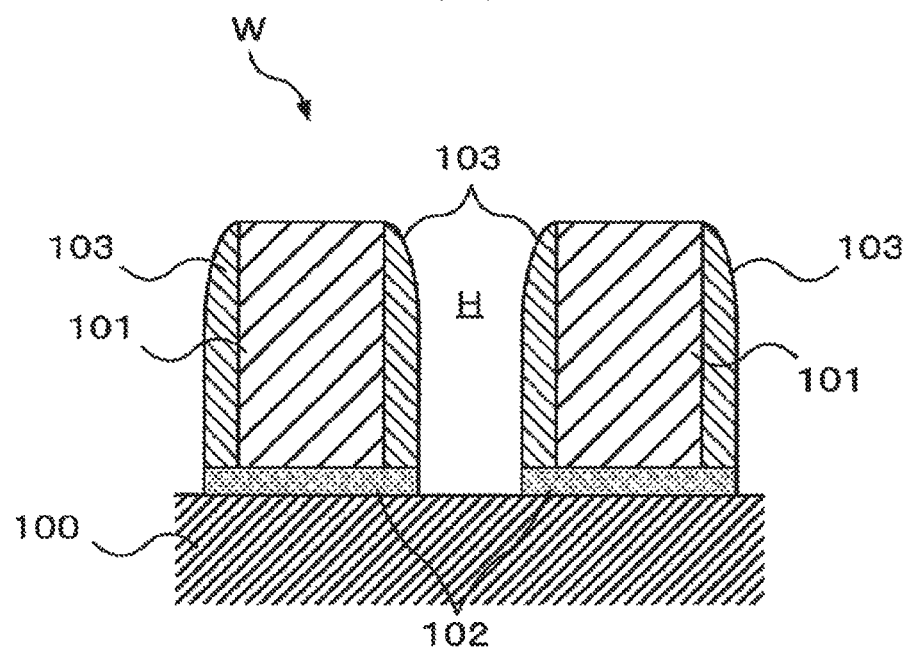
FIGS. 8A and 8B are schematic longitudinal sectional views showing another example of the surface structure of a wafer to be etched by the etching method according to the embodiment of the present disclosure.

In a wafer W shown in FIG. 8A, an interlayer insulating film 101 is formed on the surface of a Si layer 100 and a trench H is formed in the interlayer insulating film 101. Further, a thermal oxide film 102 is formed under the interlayer insulating film 101 so as to constitute the side wall of the bottom of the trench H. Further, a SiN film 103 is formed on the side wall portion of the trench H above the thermal oxide film 102 in the trench H. The lower end portion of the SiN film 103 is formed up to a position in contact with the upper surface of the thermal oxide film 102.

Figure 8B:
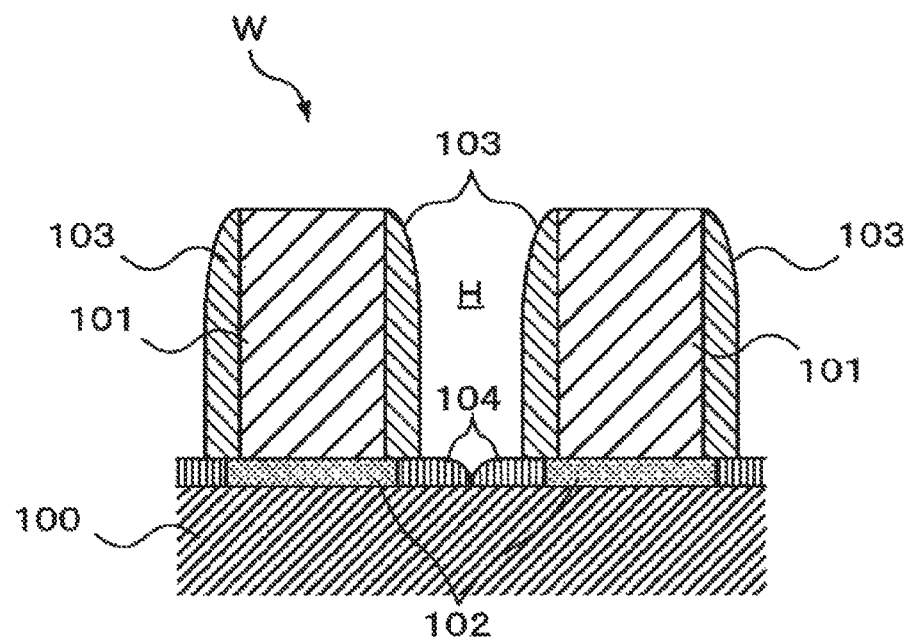

The present inventors have found that, under the conditions of 1 nm etching and 3 nm etching for the thermal oxide film 102 constituting the bottom wall of the trench H as shown in FIG. 1 by using the conventional COR process, even when the thermal oxide film 102 constituting the side wall of the bottom of the trench H as shown in FIGS. 8A and 8B is etched laterally, the etching amount does not change depending on the above conditions. That is, when the thermal oxide film 102 in the structure as shown in FIGS. 8A and 8B is modified and etched by using the conventional COR process, the amount of modification of the silicon oxide film 102 with the lapse of processing time is saturated at an early stage.

The reason for that is that, since the opening width W of the trench H is narrow, as shown in FIG. 8B, when the reaction products 104 generated by the conventional COR process protrude from the four sides in the trench H, the reaction products 104 may collide with each other at an early stage to hinder the modification into new reaction products 104. Another reason is that, although the direction of supply of the mixed gas in the COR process is perpendicular to the surface of the Si layer 100 of the wafer W, since the etching direction of the thermal oxide film 102 in the structure of FIG. 8B is parallel to the surface of the Si layer 100, the mixed gas hardly reaches the thermal oxide film 102 as etching progresses.

However, for example, as shown in FIG. 8B, after or before the reaction products 104 from a different silicon oxide film 102 collide with each other in the trench H, when the second COR process according to the present embodiment is started, the thermal oxide film 102 may be modified into different reaction products (dihydrogen hexafluorosilicate) at the interface between the reaction products 104 and the thermal oxide film 102 by using the moisture contained in the reaction products 104 as a catalyst. In addition, since the second COR process according to the present embodiment is a chemical reaction using the moisture contained in the reaction products 104 as a catalyst, it is possible to modify the thermal oxide film even when there is not much mixed gas containing hydrogen fluoride that reaches the thermal oxide film 102. Therefore, according to the present embodiment, even when the wafer W has the structure as shown in FIGS. 8A and 8B, it is possible to sufficiently modifi and efficiently etch the thermal oxide film 102 in a short time. Therefore, the productivity can be increased and the etching selectivity of the SiN film 103, which is not an etching target, to the thermal oxide film 102 can be kept high.

Figure 9A:
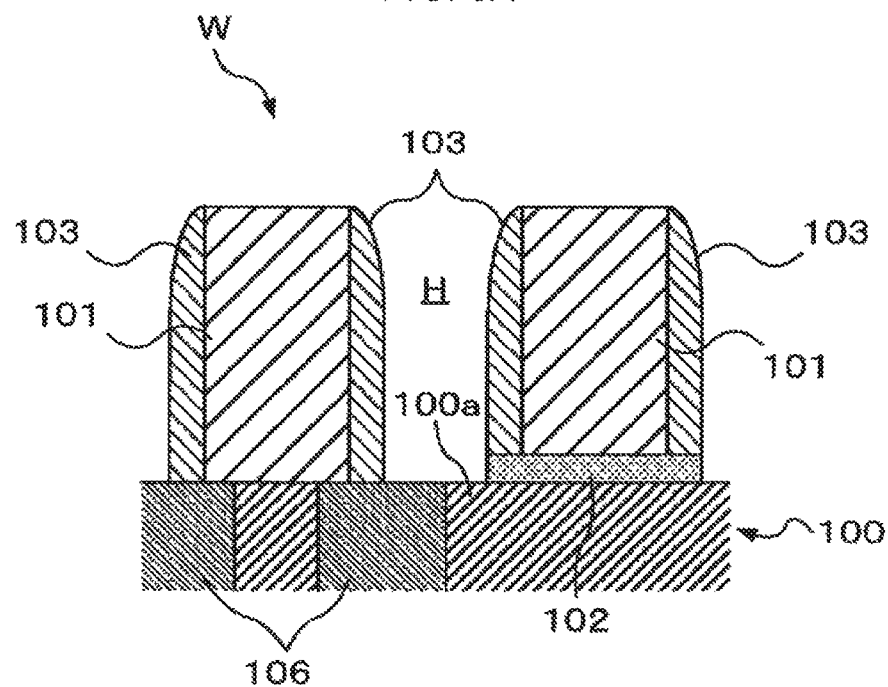
FIGS. 9A and 9B are schematic longitudinal sectional views showing another example of the surface structure of a wafer to be etched by the etching method according to the embodiment of the present disclosure.
Figure 9B:
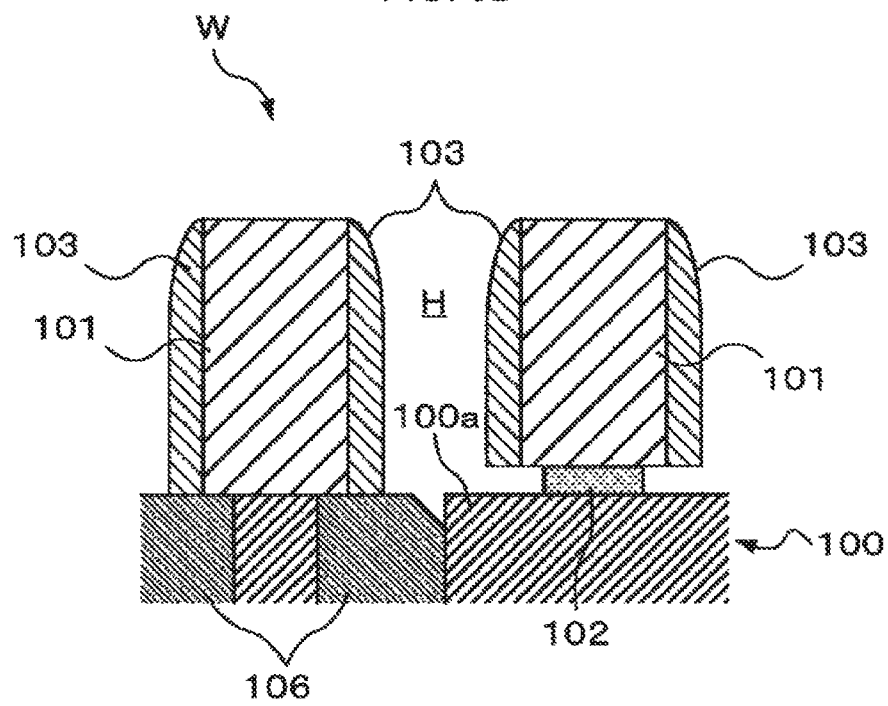

Further, the COR process according to this embodiment can be applied to a process of etching an element isolation film 106 constituting the bottom wall of the trench H while undercutting the thermal oxide film 102 constituting the side wall of the bottom of the trench H, as shown in FIGS. 9A and 9B.

In a wafer W in FIG. 9A, an element isolation film 106 is formed in the Si layer 100. The element isolation film 106 is an oxide film, specifically, an oxide film having good embeddability even at a narrow pitch, for example, a coating oxide film or a CVD oxide film. In the following description, the element isolation film 106 is assumed to be a coating oxide film and may be sometimes referred to as a coating oxide film 106.

Further, an interlayer insulating film 101 is formed on the surface of the Si layer 100 of the wafer W. A trench H as a contact hole is formed in the interlayer insulating film 101 in such a manner that both the coating oxide film 106 and an element mounting portion 100a on which the coating oxide film 106 is not formed are exposed. A thermal oxide film 102 is formed under the interlayer insulating film 101 on the element mounting portion 100a so as to form a side wall at the bottom of the trench H. In addition, a SiN film 103 is formed on the side wall portion of the trench H above the thermal oxide film 102.

In the wafer W having such a structure, as shown in FIG. 9B, the thermal oxide film 102 is undercut and the surface of the coating oxide film 106 on the element mounting portion 100a side is etched. The reasons for that are as follows.

First, one reason is for lowering the electric resistance by increasing the area of contact between a conductive member, such as a polysilicon film filling the trench H as a contact hole, and the element mounting portion 100a.

Figure 10:
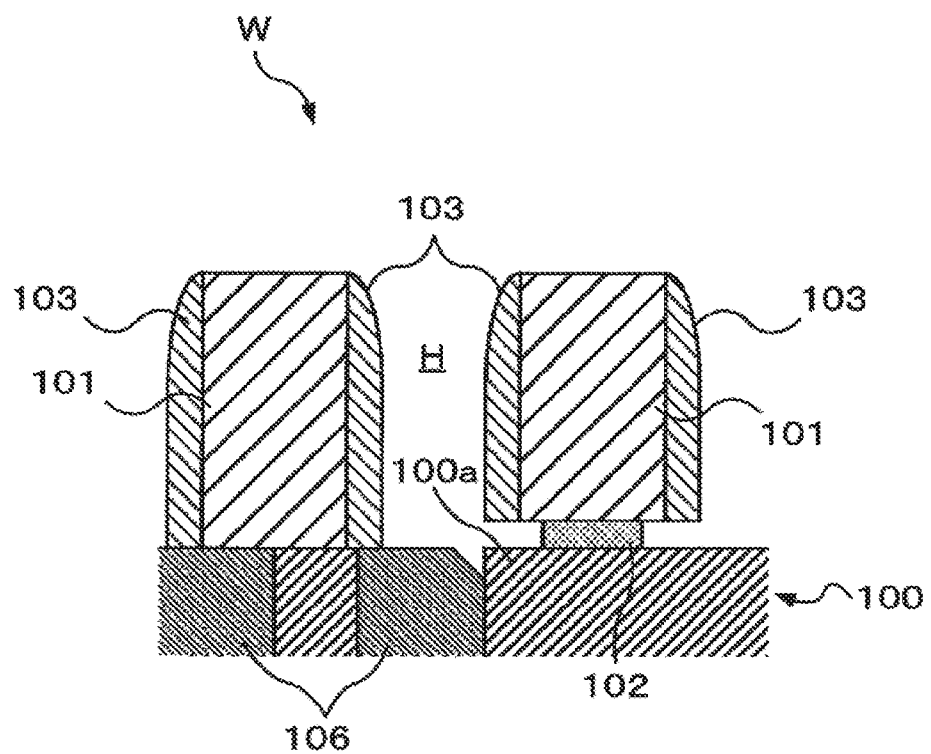
FIG. 10 is a schematic longitudinal sectional view showing another example of the surface structure of a wafer to be etched by the etching method according to the embodiment of the present disclosure.

Another reason is for ensuring electrical conduction between the conductive member in the trench H and the element mounting portion 100a even when the mask alignment occurs at the time of forming the wafer W and thus the position of the trench H relative to the element mounting portion 100a is shifted, as shown in FIG. 10.

As for the wafer W having the structure of FIGS. 9A and 9B, it is difficult to efficiently undercut the thermal oxide film 102 in the conventional COR process, as with the wafer W having the structure of FIGS. 8A and 8B. However, by using the COR process according to the present embodiment, it is possible to efficiently undercut the thermal oxide film 102 and, at the same time, to efficiently etch the coating oxide film 106 on the element mounting portion 100a side.

When different types of oxide films such as the coating oxide film 106 and the thermal oxide film 102 are simultaneously etched, the processing conditions in the COR process are set so that the etching selectivity of one type of oxide film to another type of oxide film is 0.8 to 1.2, desirably 1. If the etching selectivity is less than 0.8 or greater than 1.2, device reliability may be impaired, like e.g., short-circuiting between elements.

Examples

The etching processes (the first COR process, the second COR process and the PHT process) according to the present embodiment were performed on the wafer W having the structure shown in FIGS. 9A and 9B in which the trench H having the opening width W of 25 nm was formed. In this example, the first COR process was performed for 10 seconds, the second COR process was then performed for 10 seconds, and the series of processes was repeated 5 times. In addition, the first and second COR processes were performed with the processing atmosphere set at a pressure of 120 mTorr and the temperature of the wafer W set at 35 degrees C. In the present embodiment, the flow rate of the ammonia gas during the first COR process is 50 to 200 sccm and the flow rate of the hydrogen fluoride gas during the first COR process and the second COR process are 50 to 100 sccm. In this example, between the first COR process and the second COR process, the pressure of the process atmosphere was 120 mTorr, the temperature of the wafer W was 35 degrees C., and a nitrogen gas was supplied at 0 to 500 sccm for one minute.

On the other hand, in a comparative example, only the first COR process according to this embodiment, that is, the conventional COR process and PHT process, was performed. In the comparative example, the first COR process was performed for 20 seconds and the series of processes was repeated ten times. The other processing conditions in the first COR process were the same as those in this example.

The undercut amounts of the thermal oxide films 102 of this example and the comparative example will be described below. The undercut amount of the thermal oxide film 102 of the comparative example was 7.44 nm, whereas the undercut amount of the thermal oxide film 102 of this example where the number of times of series of processes is half of the comparative example was 7.17 nm. It can be seen from this result that the etching process of the present embodiment can undercut the thermal oxide film 102 with high productivity.

The present disclosure is useful for a technique of etching an oxide film on a substrate such as a wafer.

According to the present disclosure in some embodiments, it is possible to sufficiently etch a silicon oxide film with high productivity without etching a portion which is not an etching target.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of etching a silicon oxide film on a substrate, comprising:
   generating reaction products containing moisture by modifying the silicon oxide film by supplying a mixed gas containing a gas containing a halogen element and a basic gas onto the surface of the silicon oxide film and making chemical reaction of the silicon oxide film with the mixed gas;

generating different reaction products by modifying the silicon oxide film by supplying the gas containing a halogen element onto an interface between the silicon oxide film and the reaction products and making a chemical reaction on the silicon oxide film with the gas containing a halogen element by using the moisture contained in the reaction products; and heating and removing the reaction products and the different reaction products.

2. The method of claim 1, wherein the gas containing a halogen element is hydrogen fluoride and the basic gas is an ammonia gas.

3. The method of claim 2, wherein the different reaction products are dihydrogen hexafluorosilicate.

4. The method of claim 1, wherein the internal pressure of a chamber in which the modification is performed is kept constant from the start of the generating reaction products to the end of the generating different reaction products.

5. The method of claim 1, wherein the silicon oxide film is formed at the bottom of a trench formed in the substrate.

6. The method of claim 5, wherein the silicon oxide film constitutes a bottom wall of the trench.

7. The method of claim 5, wherein the silicon oxide film constitutes a side wall of a bottom portion of the trench.

8. The method of claim 5, wherein the silicon oxide film constitutes a bottom wall of the trench and a side wall of the bottom of the trench.

9. The method of claim 8, wherein the silicon oxide film constituting the bottom wall of the trench and the silicon oxide film constituting the side wall of the bottom of the trench are of different types.

10. A non-transitory computer-readable recording medium storing a program that causes a control computer of a processing system to perform an etching method of claim 1.

* * * * *